US012757529B2

(12) United States Patent
Aoki et al.

(10) Patent No.: US 12,757,529 B2
(45) Date of Patent: Oct. 6, 2026

(54) LIGHT EMITTING DEVICE

(71) Applicant: Japan Display Inc., Tokyo (JP)

(72) Inventors: Hayata Aoki, Tokyo (JP); Masumi Nishimura, Tokyo (JP); Hiroumi Kinjo, Tokyo (JP)

(73) Assignee: Japan Display Inc., Tokyo (JP)

( * ) Notice: Subject to any disclaimer, the term of this patent is extended or adjusted under 35 U.S.C. 154(b) by 379 days.

(21) Appl. No.: 18/616,855

(22) Filed: Mar. 26, 2024

(65) Prior Publication Data

US 2024/0274752 A1 Aug. 15, 2024

Related U.S. Application Data

(63) Continuation of application No. PCT/JP2022/029693, filed on Aug. 2, 2022.

(30) Foreign Application Priority Data

Oct. 5, 2021 (JP) ................................ 2021-164232

(51) Int. Cl.
*H10H 20/825* (2025.01)
*H10H 20/814* (2025.01)
(Continued)

(52) U.S. Cl.
CPC ........ *H10H 20/825* (2025.01); *H10H 20/814* (2025.01); *H10H 20/817* (2025.01); *H10W 90/00* (2026.01)

(58) Field of Classification Search
None
See application file for complete search history.

(56) References Cited

U.S. PATENT DOCUMENTS 8,791,474 B1 7/2014 Bibl et al.
8,809,897 B2 * 8/2014 Odnoblyudov .... H10H 20/0137 438/23
(Continued)

FOREIGN PATENT DOCUMENTS

JP 2000091628 A 3/2000
JP 2000-269605 A 9/2000
(Continued)

OTHER PUBLICATIONS

English machine translation of Office Action dated Feb. 17, 2026, issued in JP Appl. No. 2025-067434, 8 pages.
(Continued)

*Primary Examiner* — Michael Lebentritt
(74) *Attorney, Agent, or Firm* — Maier & Maier, PLLC

(57) ABSTRACT

A light emitting device includes a plurality of pixels arranged in a matrix in a first direction and in a second direction orthogonal to the first direction. Each of the plurality of pixels includes an amorphous substrate, a semi-transparent reflective layer over the amorphous substrate, a first insulating alignment layer over the semi-transparent reflective layer, a first semiconductor layer over the first insulating alignment layer, a light emitting layer over the first semiconductor layer, a second semiconductor layer over the light emitting layer, and an electrode layer over the second semiconductor layer. Each of the first semiconductor layer, the light emitting layer, and the second semiconductor layer includes gallium nitride.

20 Claims, 16 Drawing Sheets

(51) Int. Cl.
*H10H 20/817* (2025.01)
*H10W 90/00* (2026.01)

(56) References Cited

U.S. PATENT DOCUMENTS

| | | | | |
|---|---|---|---|---|
| 10,177,124 | B1 | 1/2019 | Huang et al. | |
| 2004/0135166 | A1* | 7/2004 | Yamada | H10H 20/018 257/E33.068 |
| 2008/0108206 | A1* | 5/2008 | Shimomura | B23K 26/0732 257/E21.104 |
| 2012/0091474 | A1* | 4/2012 | Or-Bach | H10F 10/19 257/443 |
| 2017/0263808 | A1* | 9/2017 | Hyun | H10H 20/01 |
| 2018/0048120 | A1* | 2/2018 | Yoshida | H01S 5/021 |
| 2018/0294286 | A1* | 10/2018 | Yamaguchi | G02F 1/136227 |
| 2024/0413142 | A1* | 12/2024 | Lee | H10D 30/6723 |

FOREIGN PATENT DOCUMENTS

| | | | | | |
|---|---|---|---|---|---|
| JP | 2010-500751 | A | | 1/2010 | |
| JP | 6329709 | B1 | * | 5/2018 | H10H 20/018 |
| JP | 2019129305 | A | | 8/2019 | |
| KR | 20150088117 | A | * | 7/2015 | H10H 20/84 |
| TW | 449949 | B | * | 8/2001 | |
| TW | 540167 | B | * | 7/2003 | H10H 20/8215 |
| TW | 201637237 | A | * | 10/2016 | H10P 14/46 |
| WO | WO-0016455 | A1 | * | 3/2000 | H01S 5/34333 |
| WO | 2008/019059 | A2 | | 2/2008 | |
| WO | WO-2010150809 | A1 | * | 12/2010 | H10H 20/81 |
| WO | WO-2023074098 | A1 | * | 5/2023 | H10H 29/142 |

OTHER PUBLICATIONS

International Search Report issued Oct. 25, 2022, in corresponding International Application No. PCT/JP2022/029693, 3 pages.

Office Action issued on Oct. 8, 2024, in corresponding Japanese Application No. 2023-552709, 8 pages.

* cited by examiner

100A2-px 100C-px

LIGHT EMITTING DEVICE

CROSS-REFERENCE TO RELATED APPLICATIONS

This application is a Continuation of International Patent Application No. PCT/JP2022/029693, filed on Aug. 2, 2022, which claims the benefit of priority to Japanese Patent Application No. 2021-164232, filed on Oct. 5, 2021, the entire contents of which are incorporated herein by reference.

FIELD

An embodiment of the present invention relates to a light emitting device including a nitride semiconductor. Further, an embodiment of the present invention relates to a light emitting device forming substrate on which a plurality of light emitting devices including a nitride semiconductor are formed.

BACKGROUND

Gallium nitride (GaN) is characterized as a direct bandgap semiconductor with a large bandgap. The characteristics of gallium nitride are utilized, and a light emitting diode (LED) using gallium nitride has already been in practical use. A gallium nitride film for an LED is generally formed on a sapphire substrate at a high temperature of 800 degrees to 1000 degrees using MOCVD (Metal Organic Chemical Vapor Deposition) or HVPE (Hydride Vapor Phase Epitaxy).

In recent years, the development of a so-called micro LED display device or a mini-LED display device in which minute micro LEDs are mounted in pixels on a circuit substrate is proceeding as a next-generation display device (or a next-generation light emitting device). The micro LED display device or the mini LED display device has high efficiency, high brightness and high reliability. Such a micro LED display device or a mini-LED display device is manufactured by transferring a LED chip to a backplane on which a transistor is formed using an oxide semiconductor or low-temperature polysilicon (for example, see U.S. Pat. No. 8,791,474).

SUMMARY

A light emitting device according to an embodiment of the present invention includes a plurality of pixels arranged in a matrix in a first direction and in a second direction orthogonal to the first direction. Each of the plurality of pixels includes an amorphous substrate, a semi-transparent reflective layer over the amorphous substrate, a first insulating alignment layer over the semi-transparent reflective layer, a first semiconductor layer over the first insulating alignment layer, a light emitting layer over the first semiconductor layer, a second semiconductor layer over the light emitting layer, and an electrode layer over the second semiconductor layer. Each of the first semiconductor layer, the light emitting layer, and the second semiconductor layer includes gallium nitride.

A light emitting device according to an embodiment of the present invention includes a plurality of pixels arranged in a matrix in a first direction and in a second direction orthogonal to the first direction. Each of the plurality of pixels includes an amorphous substrate, a first insulating alignment layer over the amorphous substrate, a semi-transparent reflective layer over the first insulating alignment layer, a first semiconductor layer over the semi-transparent reflective layer, a light emitting layer over the first semiconductor layer, a second semiconductor layer over the light emitting layer, and an electrode layer over the second semiconductor layer. Each of the first semiconductor layer, the light emitting layer, and the second semiconductor layer includes gallium nitride.

A light emitting device according to an embodiment of the present invention includes a plurality of pixels arranged in a matrix in a first direction and in a second direction orthogonal to the first direction. Each of the plurality of pixels includes an amorphous substrate, a first insulating alignment layer over the amorphous substrate, an electrode layer over the first insulating alignment layer, a first semiconductor layer over the electrode layer, a light emitting layer over the first semiconductor layer, a second semiconductor layer over the light emitting layer, and a semi-transparent layer over the second semiconductor layer. Each of the first semiconductor layer, the light emitting layer, and the second semiconductor layer includes gallium nitride.

A light emitting device forming substrate according to an embodiment of the present invention includes the plurality of light emitting devices. The amorphous substrate is one substrate on which the plurality of light emitting devices is formed.

DESCRIPTION OF EMBODIMENTS

Figure 1:
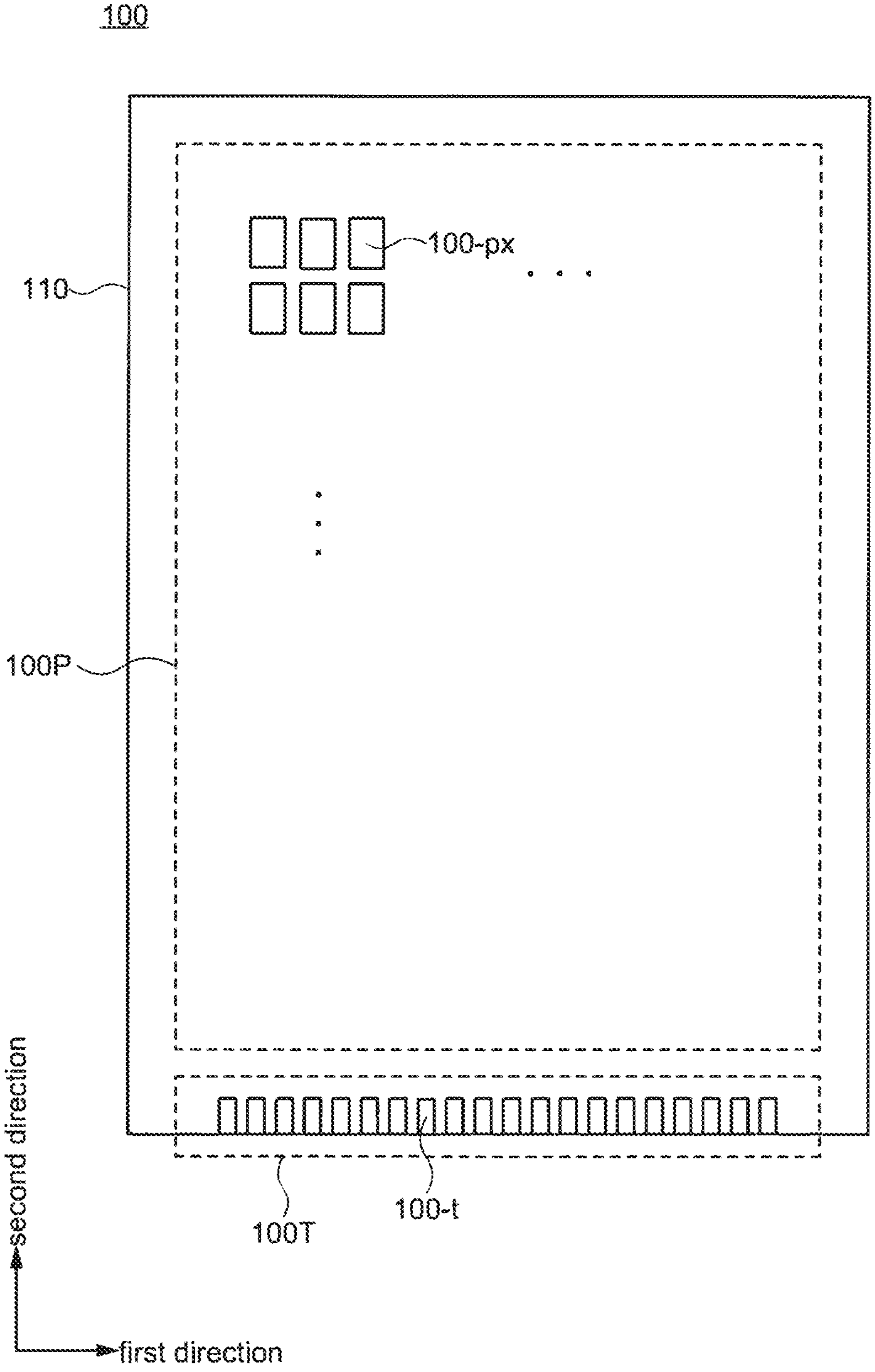
FIG. 1 is a schematic diagram showing a configuration of a light emitting device according to an embodiment of the present invention.

The method for manufacturing a micro LED display device by transferring LED chips has a high manufacturing cost, and it is difficult to manufacture the micro LED display device at low cost. On the other hand, if LEDs can be formed on a large-area substrate such as an amorphous glass substrate, the manufacturing cost can be reduced. However, as described above, since a gallium nitride film is formed on a sapphire substrate at a high temperature, it is difficult to form a gallium nitride film directly on an amorphous glass substrate.

Further, even when a gallium nitride film is formed directly on an amorphous glass substrate, the gallium nitride film, which is a high refractive index material, has a problem in that light extraction efficiency decreases.

In view of the above problem, an embodiment of the present invention can provide a light emitting device that includes a gallium nitride film formed on a large area substrate such as an amorphous glass substrate and has improved light extraction efficiency. Further, an embodiment of the present invention can provide a light emitting device forming substrate on which a plurality of light emitting devices including a gallium nitride film and having improved light extraction efficiency are formed.

Hereinafter, each of the embodiments of the present invention are described with reference to the drawings. Each of the embodiments is merely an example, and a person skilled in the art could easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

In the present specification, the expressions "a includes A, B or C", "a includes any of A, B and C", and "a includes one selected from the group consisting of A, B and C" do not exclude the case where a includes a plurality of combinations of A to C unless otherwise specified. Further, these expressions do not exclude the case where a includes other elements.

In the present specification, although the phrase "above" or "above direction" or "below" or "below direction" is used for convenience of explanation, in principle, the direction from a substrate toward a structure is referred to as "above" or "above direction" with reference to a substrate in which the structure is formed. Conversely, the direction from the structure to the substrate is referred to as "below" or "below direction". Therefore, in the expression of a structure over a substrate, one surface of the structure in the direction facing the substrate is the bottom surface of the structure and the other surface is the upper surface of the structure. In addition, the expression of a structure over a substrate only explains the vertical relationship between the substrate and the structure, and another member may be placed between the substrate and the structure. Furthermore, the terms "above" or "above direction" or "below" or "below direction" mean the order of stacked layers in the structure in which a plurality of layers are stacked, and may not be related to the position in which layers overlap in a plan view.

In the specification, terms such as "first", "second", or "third" attached to each configuration are convenient terms used to distinguish each configuration, and have no further meaning unless otherwise explained.

In the specification and the drawings, the same reference numerals may be used when multiple configurations are identical or similar in general, and reference numerals with an upper-case letter of the alphabet may be used when the multiple configurations are distinguished. Further, reference numerals with a hyphen and a lower-case letter may be used when multiple portions of one configuration are distinguished.

The following embodiments can be combined with each other as long as there is no technical contradiction.

First Embodiment

A configuration of a light emitting device 100 according to an embodiment of the present invention is described with reference to FIG. 1 to FIG. 3.

FIG. 1 is a schematic diagram showing a configuration of a light emitting device 100 according to an embodiment of the present invention. In the light emitting device 100, a pixel portion 100P and a terminal portion 100T are formed on an amorphous substrate 110. The pixel portion 100P is formed at the center of the amorphous substrate 110, and the terminal portion 100T is formed at the end of the amorphous substrate 110. The pixel portion 100P includes a plurality of pixels 100-*p* arranged in a first direction (hereinafter, referred to as a column) and a second direction (hereinafter, referred as a row) orthogonal to (intersecting) the first direction. Although the details are described later, a light emitting diode (LED) is formed in each of the plurality of pixels 100-*p*. The terminal portion 100T includes a plurality of terminals 100-*t*. A power supply line is connected to each of the plurality of terminals 100-*t*, and can apply a voltage (supply current) to the LED in the pixel 100-*p*. In addition, although the details are not shown here, a transistor may be provided in the pixel 100-*p*, and the ON or OFF of the LED may be controlled by the transistor.

Figure 2:
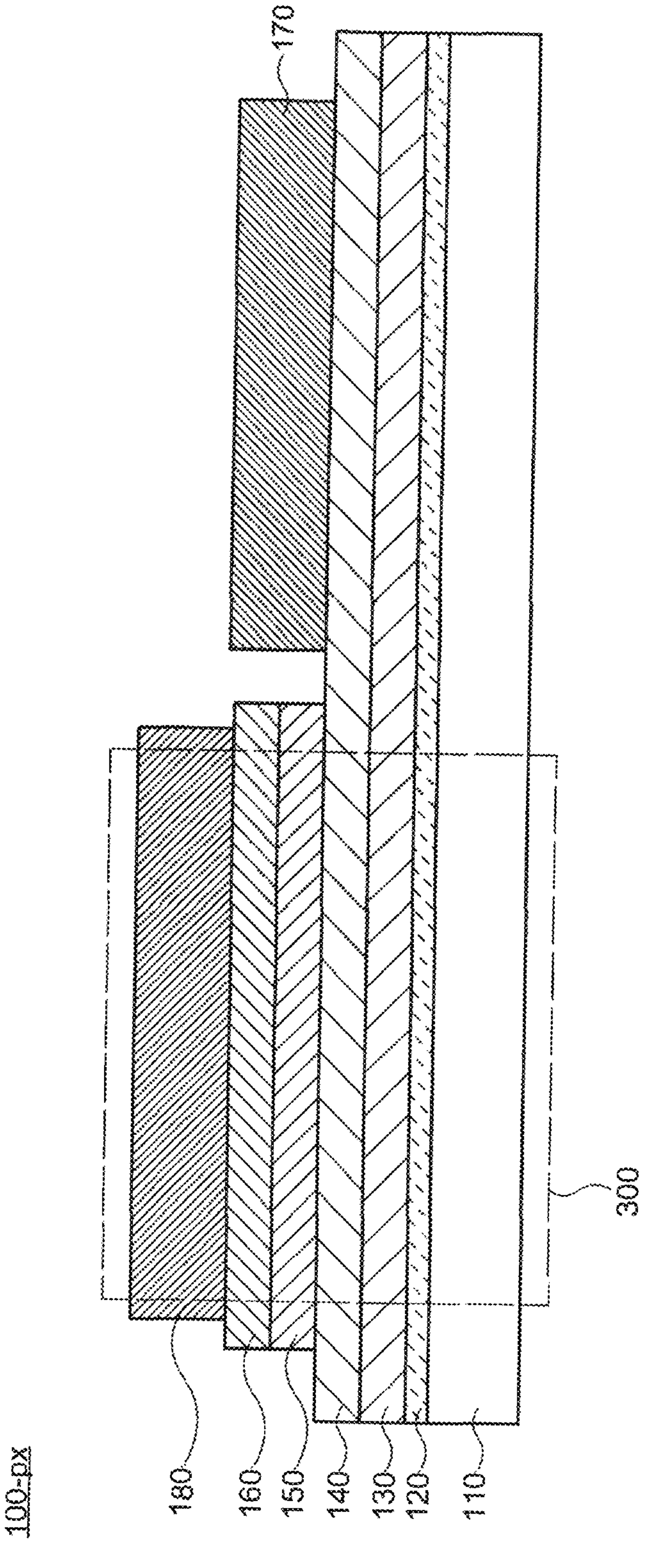
FIG. 2 is a schematic cross-sectional view showing a configuration of a pixel of a light emitting device according to an embodiment of the present invention.

FIG. 2 is a schematic cross-sectional view showing a configuration of the pixel 100-*px* of the light emitting device 100 according to an embodiment of the present invention. Further, FIG. 3 is a schematic cross-sectional view showing a region 300 in FIG. 2. As shown in FIG. 2, the pixel 100-*px* includes the amorphous substrate 110, a semi-transparent reflective layer 120, an insulating alignment layer 130, a first semiconductor layer 140, a light emitting layer 150, a second semiconductor layer 160, a first electrode layer 170, and a second electrode layer 180. That is, the pixel 100-*px* is provided with an LED including the first semiconductor layer 140, the light emitting layer 150, the second semiconductor layer 160, the first electrode layer 170, and the second electrode layer 180. The LED included in the pixel 100-*px* has a so-called horizontal electrode structure in which the first electrode layer 170 and the second electrode layer 180 are provided on one side of the light emitting layer 150. In the pixel 100-*px*, light emitted from the light emitting layer 150 transmits through the amorphous substrate 110 and is extracted to the outside.

The semi-transparent reflective layer 120 is provided on the amorphous substrate 110. The semi-transparent reflective layer 120 may be provided commonly in the plurality of pixels 100-*px*.

The insulating alignment layer 130 is provided on the semi-transparent reflective layer 120. The insulating alignment layer 130 may be provided commonly in the plurality of pixels 100-*px*.

The first semiconductor layer 140, the light emitting layer 150, and the second semiconductor layer 160 are provided over the insulating alignment layer 130 in this order. The first semiconductor layer 140 may be provided commonly in the plurality of pixels 100-*px*. Each of the light emitting layer 150 and the second semiconductor layer 160 is provided in an island shape in the pixel 100-*px*. That is, the first semiconductor layer 140 includes a region that is not covered with each of the light emitting layer 150 and the second semiconductor layer 160.

The first electrode layer 170 is provided on the first semiconductor layer 140. Specifically, the first electrode layer 170 is provided in a region that is not covered with each of the light emitting layer 150 and the second semiconductor layer 160. The second electrode layer 180 is provided on the second semiconductor layer 160. Each of the first electrode layer 170 and the second electrode layer 180 is provided in an island shape in the pixel 100-*px*. That is, the first electrode layer 170 and the second electrode layer 180 are electrically isolated.

Although not shown in the figures, an insulating layer may be provided on the first semiconductor layer 140, the light emitting layer 150, and the second semiconductor layer 160 so as to cover the light emitting layer 150 and the second semiconductor layer 160. In this case, openings are provided in the insulating layer. The first electrode layer 170 is provided to cover the opening of the insulating layer where the first semiconductor layer 140 is exposed, and the second electrode layer 180 is provided to cover the opening of the insulating layer where the second semiconductor layer 160 is exposed. Further, in this case, at least one of the first electrode layer 170 and the second electrode layer 180 may be provided in an island shape in the pixel 100-*px*. The other of the first electrode layer 170 and the second electrode layer 180 may be provided in an island shape in the pixel 100-*px*, or may be provided commonly in a plurality of pixels 100-*px* arranged in the first direction or the second direction to extend in the first direction or the second direction. Furthermore, in this case, the first electrode layer 170 and the second electrode layer 180 are electrically isolated.

Next, a material of each component is described.

The amorphous substrate 110 is a support member (a support substrate) for the light emitting device 100. Although the details are described later, each of the first semiconductor layer 140, the light emitting layer 150, and the second semiconductor layer 160 in the light emitting device 100 is formed by sputtering. Therefore, it is sufficient that the amorphous substrate 110 has a heat resistance of, for example, about 400 degrees. For example, an amorphous glass substrate can be used as the amorphous substrate 110. Further, a resin substrate such as a polyimide substrate, an acrylic substrate, a siloxane substrate, or a fluororesin substrate can also be used as the amorphous substrate 110. The amorphous glass substrate or the resin substrate is a substrate that can have a large area. Moreover, a polycrystalline substrate can also be used instead of the amorphous substrate 110. The polycrystalline substrate can have a larger area than the sapphire substrate that is used in general film formation of nitride semiconductor films, and can be used as a support member for the light emitting device 100, similar to the amorphous glass substrate or the resin substrate. In addition, the amorphous substrate 110 is provided with a thin film transistor for controlling the LED.

To explain the amorphous substrate 110 in more detail, it is preferable that the amorphous substrate 110 has a low coefficient of thermal expansion, a high strain point, and a high surface flatness. For example, it is preferable that the amorphous substrate 110 has a coefficient of thermal expansion smaller than $50\times10^{-7}$/degree and a strain point higher than or equal to 600 degrees. In addition, the amorphous substrate 110 only needs to have a heat resistance of about 400 degrees, and is not required to have a heat resistance higher than or equal to 1000 degrees like a sapphire substrate. When the amorphous substrate 110 is an amorphous glass substrate, a glass substrate formed of, for example, aluminoborosilicate glass or aluminosilicate glass can be used as the amorphous substrate 110 that satisfies the above-described characteristics. Such an amorphous glass substrate is used in a liquid crystal display or an organic electroluminescent (organic EL) display, and a large-area glass substrate called a mother glass is provided on the market. Further, it is preferable that the amorphous substrate 110 has an alkali metal content such as sodium (Na) less than or equal to 0.1%.

Although not shown in the figures, the amorphous substrate 110 may be provided with a base layer. The base layer can prevent impurities from the amorphous substrate 110 or impurities from the outside (e.g., moisture or sodium (Na), etc.) from diffusing. For example, a silicon nitride ($SiN_x$) film or the like can be used as the base layer. Further, for example, a laminated film of a silicon oxide ($SiO_x$) film and a silicon nitride ($SiN_x$) film can also be used as the base layer.

The semi-transparent reflective layer 120 can transmit or reflect light emitted from the light emitting layer 150 or light reflected by the second electrode layer 180. That is, the pixel 100-*px* includes the region 300 having a microcavity structure in which reflection is repeated between the semi-transparent reflective layer 120 and the second electrode layer 180. This improves the light extraction efficiency of the light emitting device 100. Further, in the light emitting device 100, the change in the light extraction efficiency due to a change in chromaticity is small. For example, a metal such as silver (Ag) or magnesium (Mg), or an alloy thereof can be used for the semi-transparent reflective layer 120. These metals or alloys have a thickness that allows the light emitted from the light emitting layer 150 or the light reflected by the second electrode layer 180 to pass through the semi-transparent reflective layer 120. For example, the thickness of the semi-transparent reflective layer 120 is greater than or equal to 1 nm and less than or equal to 50 nm, preferably greater than or equal to 5 nm and less than or equal to 30 nm.

The insulating alignment layer 130 can improve the crystallinity of the first semiconductor layer 140 formed on the insulating alignment layer 130. Specifically, the insulating alignment layer 130 can control so that the first semiconductor layer 140 has a c-axis orientation. "A layer has a c-axis orientation" means that the c-axis of the crystal structure of the layer is aligned in a direction substantially perpendicular to the surface on which the layer is formed. An insulating material having a hexagonal close-packed structure, a face-centered cubic structure, or a structure equivalent thereto can be used for the insulating alignment layer 130. Here, the structure equivalent to the hexagonal close-packed structure or the face-centered cubic structure includes a crystal structure in which the c-axis is not 90 degrees with respect to the a-axis and the b-axis. The insulating alignment layer 130 using the insulating material having the hexagonal close-packed structure or the structure equivalent thereto has an orientation in the (0001) direction, that is, the c-axis direction with respect to the amorphous substrate 110 (hereinafter, referred to as a (0001) orientation of the hexagonal close-packed structure). Further, the insulating alignment layer 130 using the insulating material having the face-centered cubic structure or the structure equivalent thereto has an orientation in the (111) direction with respect to the amorphous substrate 110 (hereinafter, referred to as a (111) orientation of the face-centered cubic structure). When the insulating alignment layer 130 has the (0001) orientation of the hexagonal close-packed structure or the (111) orientation of the face-centered cubic structure, the crystal growth of a film formed on the insulating alignment layer 130 is promoted. Therefore, the first semiconductor layer 140 on the insulating alignment layer 130 has a c-axis orientation. For example, aluminum nitride (AlN), aluminum oxide ($Al_2O_3$), lithium niobate (LiNbO), BiLaTiO, SrFeO, SrFeO, BiFeO, BaFeO, ZnFeO, PMnN-PZT, bioapatite (BAp) or the like can be used for the insulating alignment layer 130. In addition, the insulating alignment layer 130 can be deposited using any method (apparatus) such as sputtering or CVD.

The crystallinity of the first semiconductor layer 140 on the insulating alignment layer 130 is affected by the surface condition of the insulating alignment layer 130. Therefore, it is preferable that the insulating alignment layer 130 has a smooth surface with little unevenness. For example, the arithmetic mean roughness (Ra) of the surface of the insulating alignment layer 130 is preferably less than 2.3 nm. Further, the root mean square roughness (Rq) of the surface of the insulating alignment layer 130 is preferably less than 2.9 nm. When the surface roughness of the insulating alignment layer 130 satisfies the above conditions, the first semiconductor layer 140 has the c-axis orientation with higher crystallinity. In addition, the thickness of the insulating alignment layer 130 is preferably greater than or equal to 50 nm.

One of the first semiconductor layer 140 and the second semiconductor layer 160 transports electrons and injects the electrons into the light emitting layer 150. That is, one of the first semiconductor layer 140 and the second semiconductor layer 160 is an n-type semiconductor layer. For example, a gallium nitride film doped with silicon (Si) can be used as the n-type semiconductor layer. The other of the first semiconductor layer 140 and the second semiconductor layer 160 transports holes and injects holes into the light emitting layer 150. That is, the other of the first semiconductor layer 140 and the second semiconductor layer 160 is a p-type semiconductor layer. For example, a gallium nitride film doped with magnesium (Mg) can be used as the p-type semiconductor layer. The gallium nitride film doped with silicon or magnesium can be formed using sputtering.

The light emitting layer 150 recombines the injected electrons and holes and emits light. The light emitting layer 150 has a multiple quantum well structure. For example, a laminated film in which an indium gallium nitride (InGaN) film and a gallium nitride film are alternately laminated can be used as the light emitting layer 150. The indium gallium nitride film or the gallium nitride film can be formed using sputtering.

Here, a method for forming a gallium nitride film on the insulating alignment layer 130 using sputtering is described.

The amorphous substrate 110 on which the insulating alignment layer 130 is formed is placed to face a gallium nitride target in a vacuum chamber. It is preferable that the composition ratio of gallium nitride in the gallium nitride target is preferably greater than or equal to 0.7 and less than or equal to 2 of gallium to nitrogen. Further, nitrogen can also be supplied to the vacuum chamber as a gas other than the sputtering gas (such as argon or krypton). In that case, it is preferable that the composition ratio of gallium nitride in the gallium nitride target is more gallium than nitrogen. For example, nitrogen can be supplied using a nitrogen radical source. The sputtering power supply source may be either a DC power supply source, an RF power supply source, or a pulsed DC power supply source.

The amorphous substrate 110 in the vacuum chamber may be heated. For example, the amorphous substrate 110 can be heated at a temperature higher than or equal to room temperature and lower than 600 degrees. The temperature is preferably higher than or equal to 100 degrees and less than or equal to 400 degrees. This temperature can be applied even to the amorphous substrate 110 which has lower heat resistance that a sapphire substrate. Further, this temperature is lower than the film formation temperature in MOCVD or HVPE.

After the vacuum chamber is sufficiently evacuated, the sputtering gas is supplied to the vacuum chamber. Further, a voltage is applied between the amorphous substrate 110 and the gallium nitride target at a predetermined pressure to generate plasma and the gallium nitride film is deposited.

Although the method for forming the gallium nitride film by sputtering is described above, the configuration or conditions of the sputtering process can be changed as appropriate. In addition, an n-type semiconductor film or a p-type semiconductor film can be formed by using a silicon-doped gallium nitride target or a magnesium-doped target instead of the gallium nitride target. Further, a laminated film in which an indium gallium nitride film and a gallium nitride film are alternately laminated can be formed by using an indium gallium nitride target and a gallium nitride target.

In the light emitting device 100, each of the first semiconductor layer 140, the light emitting layer 150, and the second semiconductor layer 160 contains gallium nitride. Although the gallium nitride film of the first semiconductor layer 140 is deposited directly on the insulating alignment layer 130, the gallium nitride film of each of the light emitting layer 150 and the second semiconductor layer 160 is not deposited directly on the insulating alignment layer 130. However, since the first semiconductor layer 140 on the insulating alignment layer 130 has the c-axis orientation with high crystallinity, the first semiconductor layer 140 has the same function as the insulating alignment layer 130. Therefore, the crystal growth of the gallium nitride film deposited on the first semiconductor layer 140 in the c-axis direction is promoted, and the light emitting layer 150 on the first semiconductor layer 140 has a c-axis orientation. Similarly, the second semiconductor layer 160 on the light emitting layer 150 also has a c-axis orientation.

One of the first electrode layer 170 and the second electrode layer 180 is an n-type electrode, and the other of the first electrode layer 170 and the second electrode layer 180 is a p-type electrode. The polarities of the first electrode layer 170 and the second electrode layer 180 are determined depending on the first semiconductor layer 140 and the second semiconductor layer 160. For example, a metal such as silver (Ag) or indium (In), or an alloy thereof can be used for the n-type electrode. For example, a metal such as palladium (Pd) or gold (Au), or an alloy thereof can be used for the p-type electrode. These metals or alloys have a thickness that does not transmit the light emitted from the light emitting layer 150 or the light reflected by the semi-transparent reflective layer 120.

Although not shown in the figures, a protective layer can be provided to cover the LED, if necessary. A silicon nitride film can be used as the protective layer. Further, for example, a laminated film of a silicon oxide film and a silicon nitride film can be used as the protective layer.

As described above, the light emitting device 100 according to the present embodiment includes the region 300 having a microcavity structure. Therefore, in the light emitting device 100, the light extraction efficiency is improved, and the change in the light extraction efficiency due to a change in chromaticity is small. Further, since the LED is formed using the amorphous substrate 110 in the light emitting device 100, the manufacturing cost of the light emitting device 100 can be suppressed.

Second Embodiment

Another configuration of the light emitting device 100 according to an embodiment of the present invention is described with reference to FIG. 4A to FIG. 5. In addition, the description of the configuration similar to the configuration described above may be omitted.

Figure 4A:
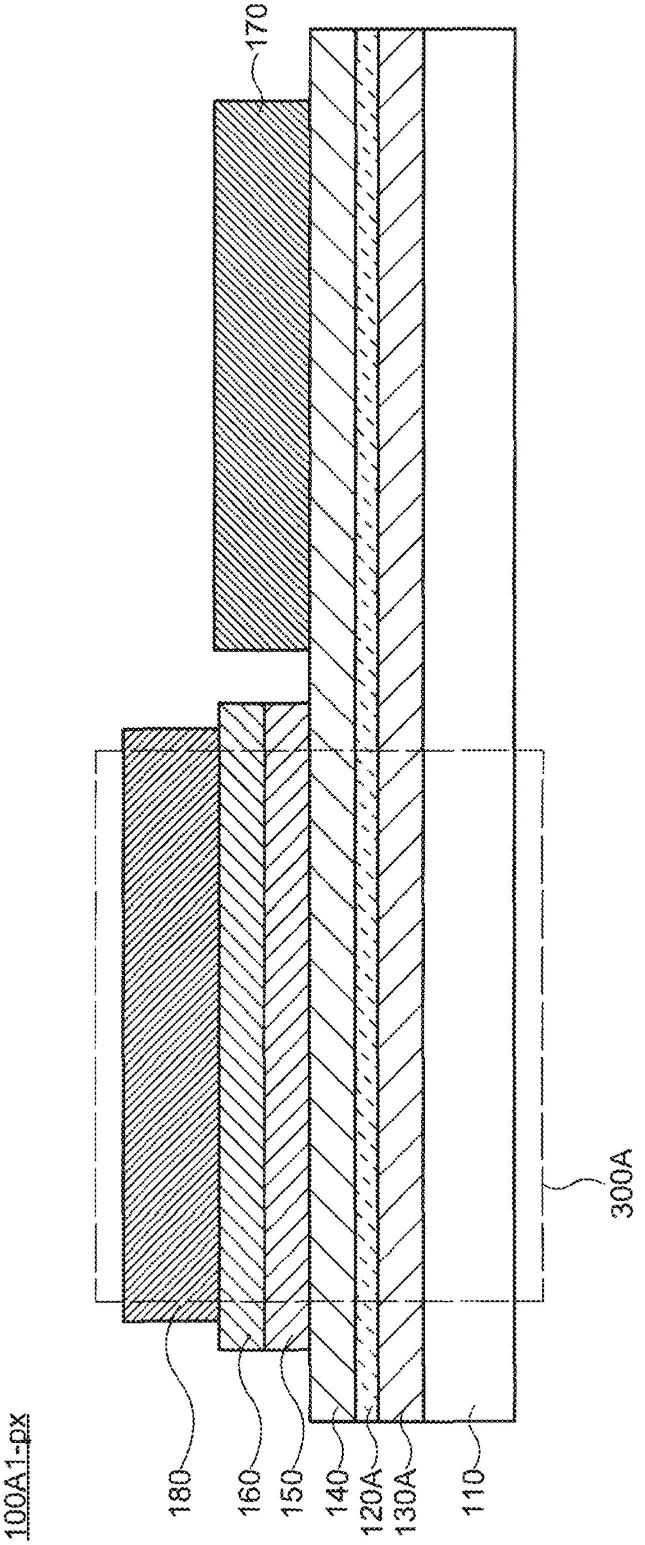
FIG. 4A is a schematic cross-sectional view showing a configuration of a pixel of a light emitting device according to an embodiment of the present invention.
Figure 4B:
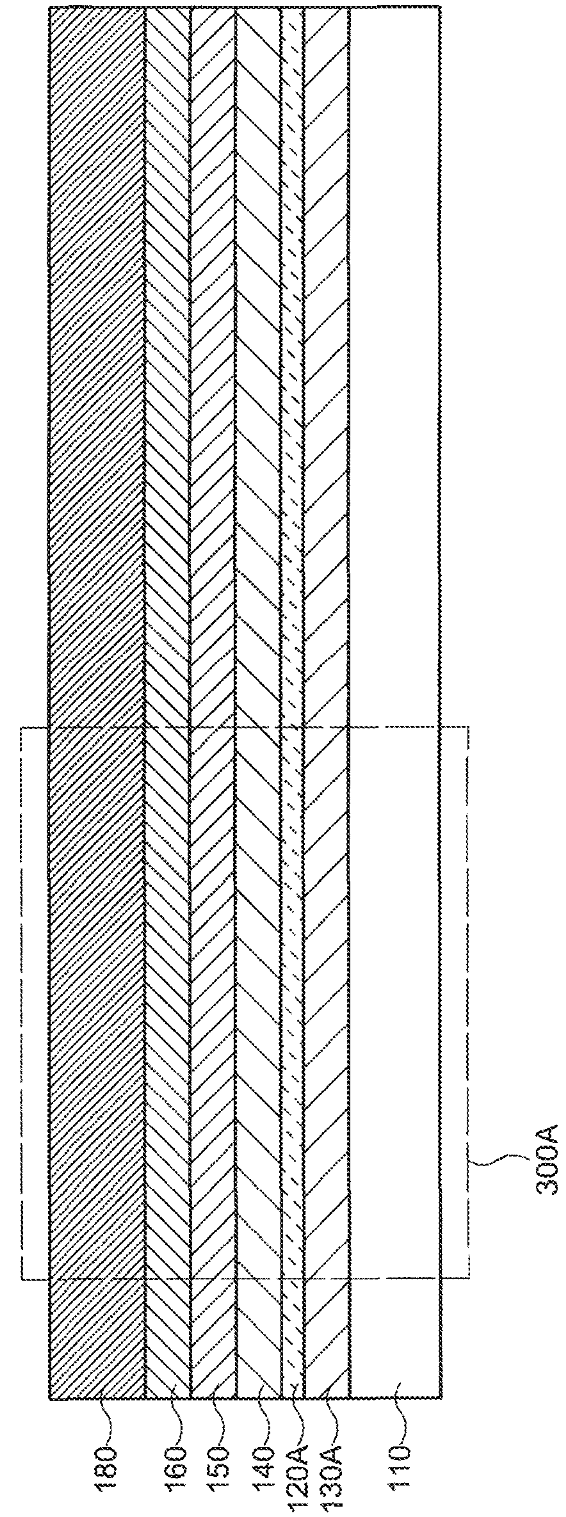
FIG. 4B is a schematic cross-sectional view showing a configuration of a pixel of a light emitting device according to an embodiment of the present invention.

FIG. 4A and FIG. 4B are schematic cross-sectional views respectively showing configurations of a pixel 100A1-*px* and a pixel 100A2-*px* of the light emitting device 100 according to an embodiment of the present invention. Further, FIG. 5 is a schematic cross-sectional view showing a region 300A in FIG. 4A or 4B. As shown in FIG. 4A, the pixel 100A1-*px* includes the amorphous substrate 110, an insulating alignment layer 130A, a semi-transparent reflective layer 120A, the first semiconductor layer 140, the light emitting layer 150, the second semiconductor layer 160, the first electrode layer 170, and the second electrode layer 180. That is, the pixel 100A1-*px* is provided with the LED including the first semiconductor layer 140, the light emitting layer 150, the second semiconductor layer 160, the first electrode layer 170, and the second electrode layer 180. The LED included in the pixel 100A1-*px* has a so-called horizontal electrode structure in which the first electrode layer 170 and the second electrode layer 180 are provided on one side of the light emitting layer 150. In the pixel 100A1-*px*, light emitted from the light emitting layer 150 transmits through the amorphous substrate 110 and is extracted to the outside.

Further, as shown in FIG. 4B, the pixel 100A2-*px* includes the amorphous substrate 110, the insulating alignment layer 130A, the semi-transparent reflective layer 120A, the first semiconductor layer 140, the light emitting layer 150, the second semiconductor layer 160, and the second electrode layer 180. Although details are described later, the semi-transparent reflective layer 120A can function as an electrode of an LED. Therefore, the pixel 100A2-*px* is provided with the LED including the semi-transparent reflective layer 120A, the first semiconductor layer 140, the light emitting layer 150, the second semiconductor layer 160, and the second electrode layer 180. The LED included in the pixel 100A2-*px* has a so-called vertical electrode structure in which the semi-transparent reflective layer 120A functioning as an electrode is provided on one side of the light emitting layer 150, and the second electrode layer 180 is provided on the other side of the light emitting layer 150. In the pixel 100A2-*px*, light emitted from the light emitting layer 150 transmits through the amorphous substrate 110 and is extracted to the outside.

In addition, both the pixel 100A1-*px* and the pixel 100A2-*px* include the region 300A having a microcavity structure in which reflection is repeated between the semi-transparent reflective layer 120A and the second electrode layer 180.

In each of pixel 100A1-*px* and pixel 100A2-*px*, the insulating alignment layer 130A is provided on the amorphous substrate 110. The semi-transparent reflective layer 120A is provided on the insulating alignment layer 130A. The first semiconductor layer 140 is provided on the semi-transparent reflective layer 120A. That is, the first semiconductor layer 140 is not provided in contact with the insulating alignment layer 130A. However, since the thickness of the semi-transparent reflective layer 120A is small enough to allow light to pass through, the insulating alignment layer 130A can control the crystallinity of the first semiconductor layer 140 through the semi-transparent reflective layer 120A. Therefore, the first semiconductor layer 140 provided on the semi-transparent reflective layer 120A has a c-axis orientation with high crystallinity.

Further, in the pixel 100A2-*px*, the semi-transparent reflective layer 120A can be used for an electrode for the LED. When the resistance of the semi-transparent reflective layer 120A is large, the semi-transparent reflective layer 120A may include a transparent conductive oxide such as indium tin oxide (ITO) or indium zinc oxide (IZO). That is, a laminated film of a metal or an alloy and a transparent conductive oxide may be provided on at least a portion of the semi-transparent reflective layer 120A. Thereby, the resistance of the semi-transparent reflective layer 120A can be reduced.

As described above, the light emitting device 100 according to the present embodiment includes the region 300A having a microcavity structure. Therefore, in the light emitting device 100, the light extraction efficiency is improved, and the change in the light extraction efficiency due to a change in chromaticity is small. Further, since the LED is formed using the amorphous substrate 110 in the light emitting device 100, the manufacturing cost of the light emitting device 100 can be suppressed.

Third Embodiment

Another configuration of the light emitting device 100 according to an embodiment of the present invention is described with reference to FIG. 6 and FIG. 7. In addition, the description of the configuration similar to the configuration described above may be omitted.

Figure 6:
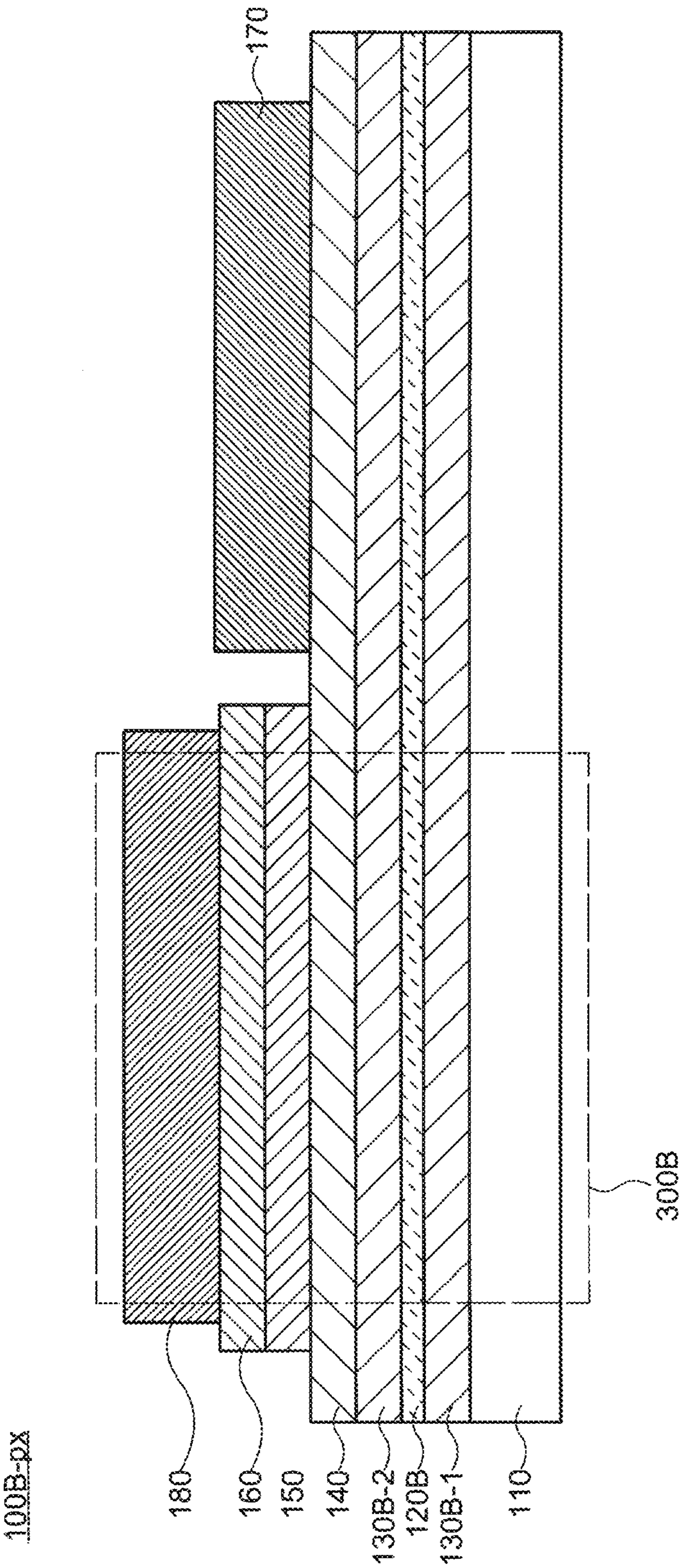
FIG. 6 is a schematic cross-sectional view showing a configuration of a pixel of a light emitting device according to an embodiment of the present invention.

FIG. 6 is a schematic cross-sectional view showing a configuration of a pixel 100B-px of the light emitting device 100 according to an embodiment of the present invention. As shown in FIG. 6, the pixel 100B-px includes the amorphous substrate 110, a first insulating alignment layer 130B-1, a semi-transparent reflective layer 120B, a second insulating alignment layer 130B-2, a first insulating alignment layer 130B-1, the semiconductor layer 140, the light emitting layer 150, the second semiconductor layer 160, the first electrode layer 170, and the second electrode layer 180. That is, the pixel 100B-px is provided with the LED including the first semiconductor layer 140, the light emitting layer 150, the second semiconductor layer 160, the first electrode layer 170, and the second electrode layer 180. The LED included in the pixel 100B-px has a so-called horizontal electrode structure in which the first electrode layer 170 and the second electrode layer 180 are provided on one side of the light emitting layer 150. In the pixel 100B-px, light emitted from the light emitting layer 150 transmits through the amorphous substrate 110 and is extracted to the outside.

In addition, the pixel 100B-px includes a region 300B having a microcavity structure in which reflection is repeated between the semi-transparent reflective layer 120B and the second electrode layer 180.

In pixel 100B-px, the first insulating alignment layer 130B-1 is provided on the amorphous substrate 110. The semi-transparent reflective layer 120B is provided on the first insulating alignment layer 130B-1. The second insulating alignment layer 130B-2 is provided on the semi-transparent reflective layer 120B. The first semiconductor layer 140 is provided on the second insulating alignment layer 130B-2. When the first semiconductor layer 140 is provided on the semi-transparent reflective layer 120B, the c-axis orientation of the first semiconductor layer 140 may not be sufficient. In that case, the second insulating alignment layer 130B-2 is provided on the first semiconductor layer 140. As a result, since the second insulating alignment layer 130B-2 can control the crystallinity of the first semiconductor layer 140, the first semiconductor layer 140 has the c-axis orientation with high crystallinity. Further, since the second insulating alignment layer 130B-2 is located between the semi-transparent reflective layer 120B and the second electrode layer 180, the optical distance of the microcavity structure can also be adjusted by the thickness of the second insulating alignment layer 130B-2. For example, the thickness of the second insulating alignment layer 130B-2 can be larger than the thickness of the first insulating alignment layer 130B-1.

As described above, the light emitting device 100 according to the present embodiment includes the region 300B having a microcavity structure. Therefore, in the light emitting device 100, the light extraction efficiency is improved, and the change in the light extraction efficiency due to a change in chromaticity is small. Further, since the LED is formed using the amorphous substrate 110 in the light emitting device 100, the manufacturing cost of the light emitting device 100 can be suppressed.

Fourth Embodiment

Another configuration of the light emitting device 100 according to an embodiment of the present invention is described with reference to FIG. 8 and FIG. 9. In addition, the description of the configuration similar to the configuration described above may be omitted.

Figure 8:
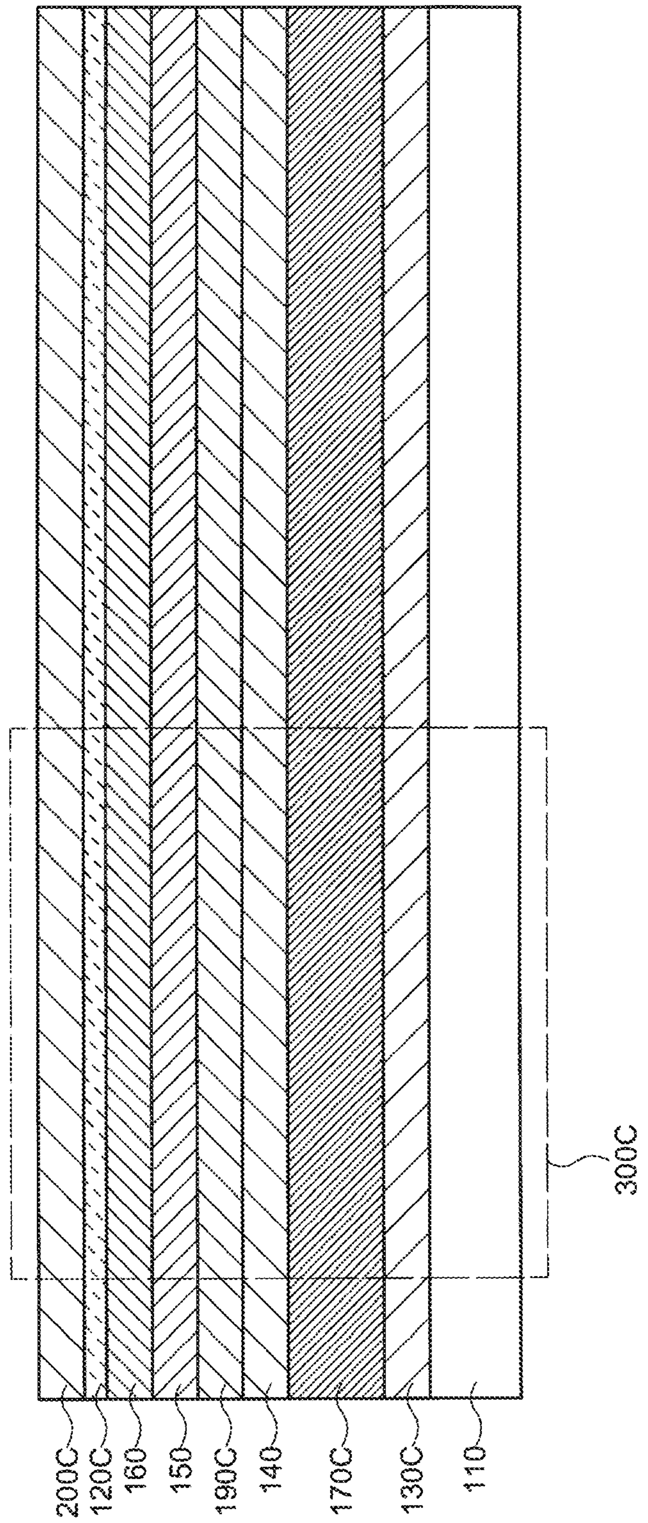
FIG. 8 is a schematic cross-sectional view showing a configuration of a pixel of a light emitting device according to an embodiment of the present invention.
Figure 9:
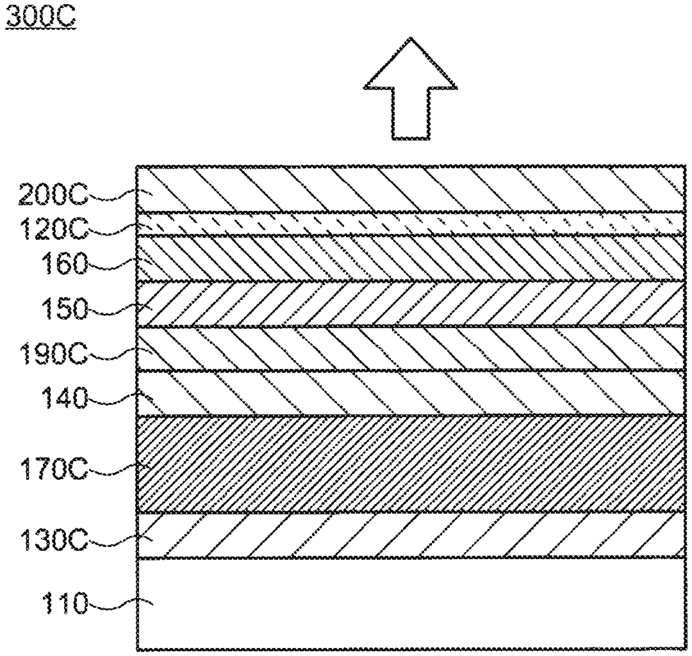
FIG. 9 is a schematic cross-sectional view showing a region of FIG. 8.

FIG. 8 is a schematic cross-sectional view showing a configuration of a pixel 100C-px of the light emitting device 100 according to an embodiment of the present invention. As shown in FIG. 8, the pixel 100C-px includes the amorphous substrate 110, an insulating alignment layer 130C, a conductive alignment layer 170C, the first semiconductor layer 140, an optical distance adjustment layer 190C, the light emitting layer 150, the second semiconductor layer 160, a semi-transparent reflective layer 120C, and the insulating layer 200C. The conductive alignment layer 170C and the semi-transparent reflective layer 120C can function as first and second electrodes of an LED, respectively. Therefore, the pixel 100C-px is provided with the LED including the conductive alignment layer 170C as a first electrode layer, the first semiconductor layer 140, the light emitting layer 150, the second semiconductor layer 160, and the semi-transparent reflective layer 120C as a second electrode layer. The LED included in the pixel 100C-*px* has a so-called vertical electrode structure in which the conductive alignment layer 170C functioning as the first electrode layer is provided on one side of the light emitting layer 150, and the semi-transparent reflective layer 120C functioning as the second electrode layer is provided on the other side of the light emitting layer 150. In the pixel 100C-*px*, light emitted from the light emitting layer 150 transmits through the insulating layer 200C and is extracted to the outside.

The conductive alignment layer 170C can improve the crystallinity of the first semiconductor layer 140 formed on the conductive alignment layer 170. For example, titanium (Ti), titanium nitride ($TiN_x$), titanium oxide ($TiO_x$), graphene, zinc oxide (ZnO), magnesium diboride ($MgB_2$), aluminum (Al), silver (Ag), calcium (Ca), nickel (Ni), copper (Cu), strontium (Sr), rhodium (Rh), palladium (Pd), cerium (Ce), ytterbium (Yb), iridium (Ir), platinum (Pt), gold (Au), lead (Pb), actinium (Ac), thorium (Th), BiLaTiO, SrFeO, BiFeO, BaFeO, ZnFeO, PMnN-PZT, or the like can be used for the conductive alignment layer 170C. In addition, the conductive alignment layer 170C can be deposited using any method (apparatus) such as sputtering or CVD.

The insulating alignment layer 130C is provided on the amorphous substrate 110. The conductive alignment layer 170C is provided on the insulating alignment layer 130C. The first semiconductor layer 140 is provided on the conductive alignment layer 170C. The optical distance adjustment layer 190C is provided on the first semiconductor layer 140. The light emitting layer 150 is provided on the optical distance adjustment layer 190C. The second semiconductor layer 160 is provided on the light emitting layer 150. The semi-transparent reflective layer 120C is provided on the second semiconductor layer 160. The insulating layer 200C is provided on the semi-transparent reflective layer 120C.

Each of the insulating alignment layer 130C, the conductive alignment layer 170C, the first semiconductor layer 140, the optical distance adjustment layer 190C, the light emitting layer 150, the second semiconductor layer 160, the semi-transparent reflective layer 120C, and the insulating layer 200C may be provided commonly in a plurality of pixels 100C-px. Further, although not shown in the figures, the conductive alignment layer 170C may be provided in an island shape in the pixel 100C-px, and the semi-transparent reflective layer 120C may be provided commonly in the plurality of pixels 100C-px. Although not shown in the figures, the conductive alignment layer 170C may be provided commonly in a plurality of pixels 100C-px arranged in the first direction extending in the first direction, and the semi-transparent reflective layer 120C may be provided commonly in a plurality of pixels 100C-px arranged in the second direction extending in the second direction.

The optical distance adjustment layer 190C can adjust the optical distance of the microcavity structure. Specifically, as the wavelength of the extracted light becomes larger, the thickness of the optical distance adjustment layer 190C is increased. For example, gallium nitride can be used for the optical distance adjustment layer 190C. The material of the optical distance adjustment layer 190C is the same as the material of the first semiconductor layer 140. In that case, the optical distance adjustment layer 190C can be a portion of the first semiconductor layer 140. Therefore, the optical distance of the microcavity structure can be adjusted by changing the thickness of the first semiconductor layer 140.

Although not shown in the figures, the optical distance adjustment layer 190C may be provided between the conductive alignment layer 170C and the first semiconductor layer 140.

The insulating layer 200C can emit the light incident on the insulating layer 200C from the semi-transparent reflective layer 120C to the outside. The insulating layer 200C preferably has a high refractive index in order to improve the light extraction efficiency of the light emitting device 100. For example, aluminum nitride (AlN) can be used for the insulating layer 200C. In addition, the insulating layer 200C can be formed using any method (apparatus) such as sputtering or CVD.

Although not shown in the figures, the surface of the insulating layer 200C may be provided with unevenness. Thereby, the light extraction efficiency of the light emitting device 100 can be further improved.

In the pixel 100C-px, although the first semiconductor layer 140 is not provided in contact with the insulating alignment layer 130C, the first semiconductor layer 140 is provided in contact with the conductive alignment layer 170C. Therefore, the first semiconductor layer 140 has a c-axis orientation with high crystallinity. Further, the conductive alignment layer 170C provided on the insulating alignment layer 130C has crystallinity that reflects the influence of the insulating alignment layer 130C. Thus, the first semiconductor layer 140 provided on the conductive alignment layer 130C is also influenced by the insulating alignment layer 130C. Therefore, the first semiconductor layer 140 formed over the insulating alignment layer 130C and the conductive alignment layer 170C has a c-axis orientation with even higher crystallinity.

As described above, the light emitting device 100 according to the present embodiment includes the region 300C having a microcavity structure. Therefore, in the light emitting device 100, the light extraction efficiency is improved, and the change in the light extraction efficiency due to a change in chromaticity is small. Further, since the LED is formed using the amorphous substrate 110 in the light emitting device 100, the manufacturing cost of the light emitting device 100 can be suppressed.

EXAMPLES

Simulations were performed of current efficiency and change in chromaticity of current efficiency for the microcavity structures of the regions 300 to 300B of the light emitting device 100 according to the First to Third Embodiments. The simulations were performed using Setfos (manufactured by Fluxim). Further, in the simulation, the thickness of the insulating alignment layer was changed, and the other thicknesses were kept at fixed values.

1. Example 1

Figure 3:
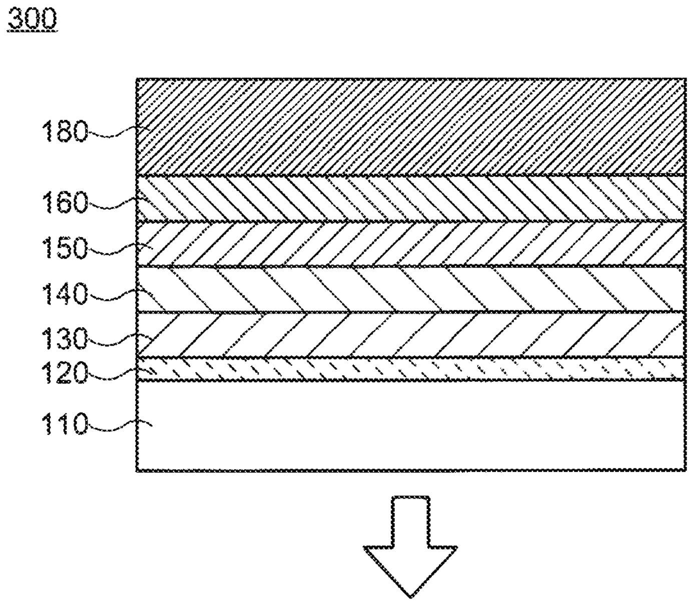
FIG. 3 is a schematic cross-sectional view showing a region of FIG. 2.
Figure 10:
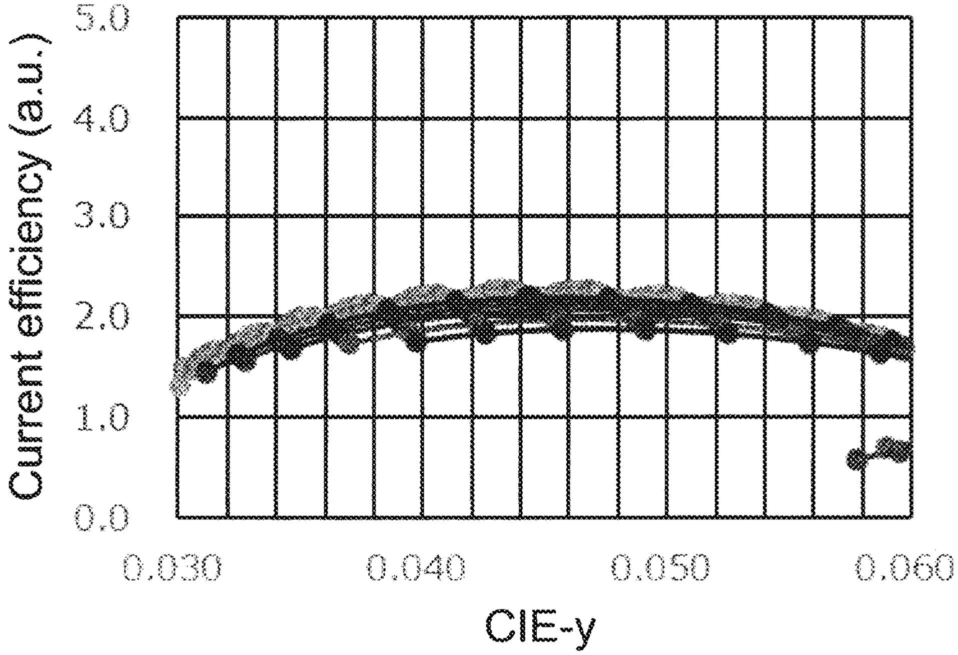
FIG. 10 is a graph showing current efficiency with respect to change in chromaticity (a y coordinate of chromaticity coordinate) in a microcavity structure in a region shown in FIG. 3.

FIG. 10 is a graph showing current efficiency with respect to change in chromaticity (a y coordinate of chromaticity coordinate) in the microcavity structure of the region 300 shown in FIG. 3. In the simulation of the region 300 shown in FIG. 3, glass, magnesium silver (MgAg), aluminum nitride (AlN), and silver (Ag) were used for parameters of the amorphous substrate 110, the semi-transparent reflective layer 120, the insulating alignment layer 130, and the second electrode layer 180, respectively. Gallium nitride (GaN) was used for all parameters of the first semiconductor layer 140, the light emitting layer 150, and the second semiconductor layer 160. Further, the thicknesses of the amorphous substrate 110, the semi-transparent reflective layer 120, the first semiconductor layer 140, the light emitting layer 150, the second semiconductor layer 160, and the second electrode layer 180 were 0.5 mm, 15 nm, 10 nm, 20 nm, 20 nm, and 100 nm, respectively. Furthermore, the emission spectrum of the light emitting layer 150 was a normal distribution with a peak at a wavelength of 460 nm.

2. Example 2

Figure 5:
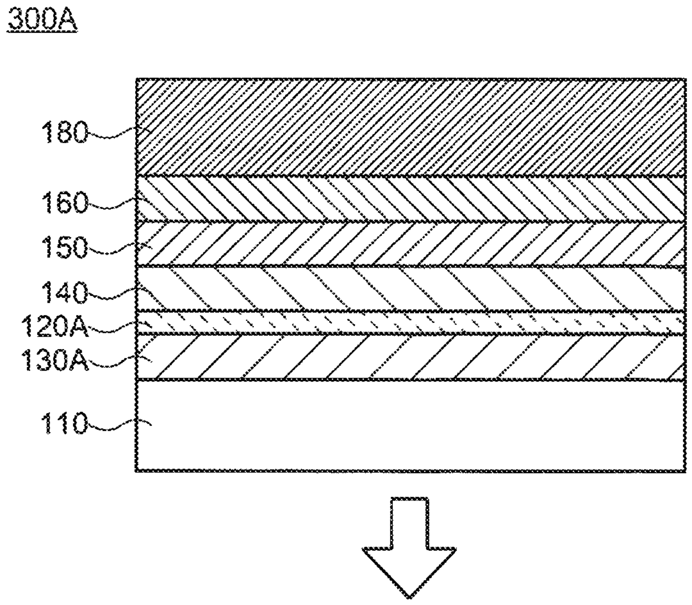
FIG. 5 is a schematic cross-sectional view showing a region of FIG. 4A or FIG. 4B.
Figure 11:
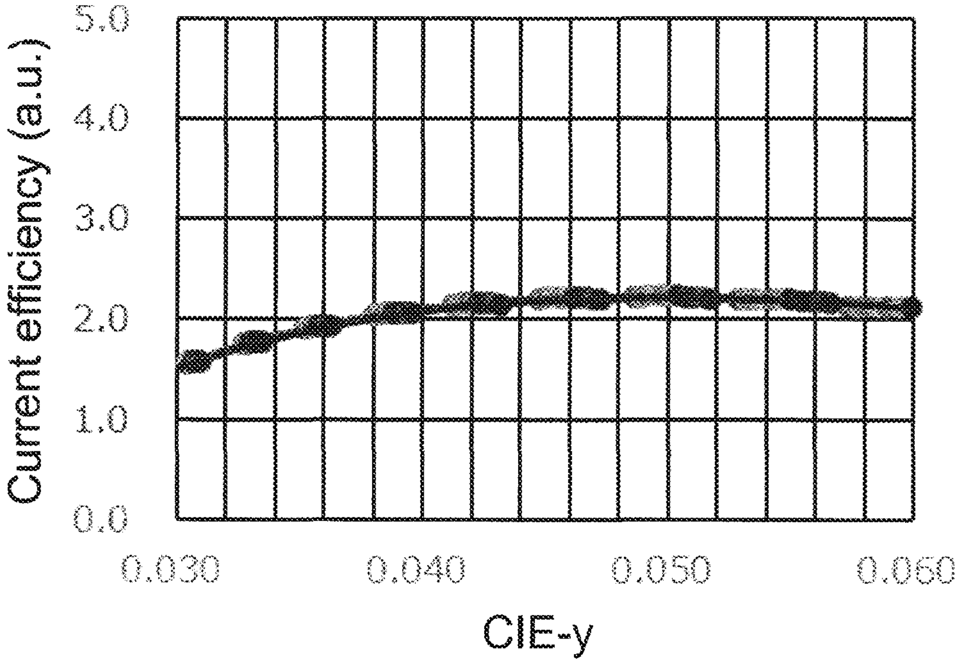
FIG. 11 is a graph showing current efficiency with respect to change in chromaticity (a y coordinate of chromaticity coordinate) in a microcavity structure in a region shown in FIG. 4.

FIG. 11 is a graph showing current efficiency with respect to change in chromaticity (a y coordinate of chromaticity coordinate) in the microcavity structure of the region 300A shown in FIG. 5. In the simulation of the region 300A shown in FIG. 5, glass, aluminum nitride (AlN), magnesium silver (MgAg), and silver (Ag) were used for parameters of the amorphous substrate 110, the insulating alignment layer 130A, the semi-transparent reflective layer 120A, and the second electrode layer 180, respectively. Gallium nitride (GaN) was used for all parameters of the first semiconductor layer 140, the light emitting layer 150, and the second semiconductor layer 160. Further, the thicknesses of the amorphous substrate 110, the semi-transparent reflective layer 120A, the first semiconductor layer 140, the light emitting layer 150, the second semiconductor layer 160, and the second electrode layer 180 were 0.5 mm, 15 nm, 10 nm, 20 nm, 20 nm, and 100 nm, respectively. Furthermore, the emission spectrum of the light emitting layer 150 was a normal distribution with a peak at a wavelength of 460 nm.

3. Example 3

Figure 7:
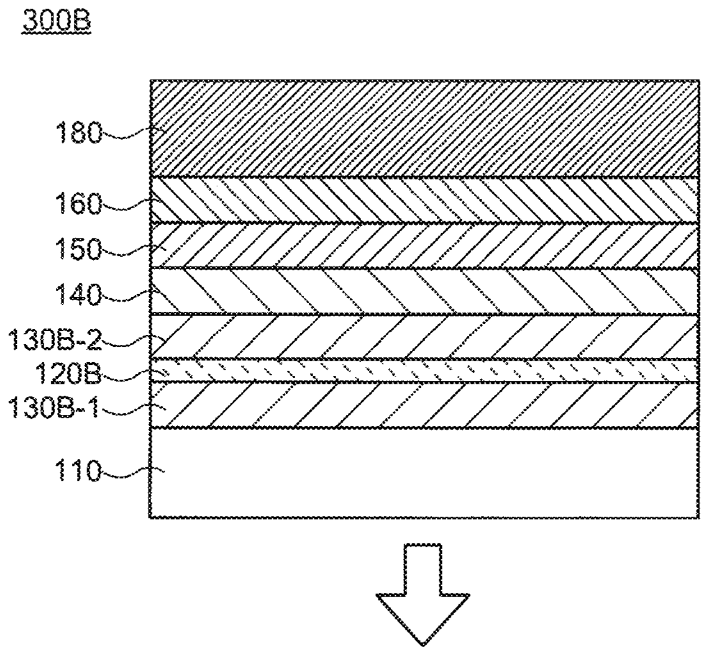
FIG. 7 is a schematic cross-sectional view showing a region of FIG. 6.
Figure 12:
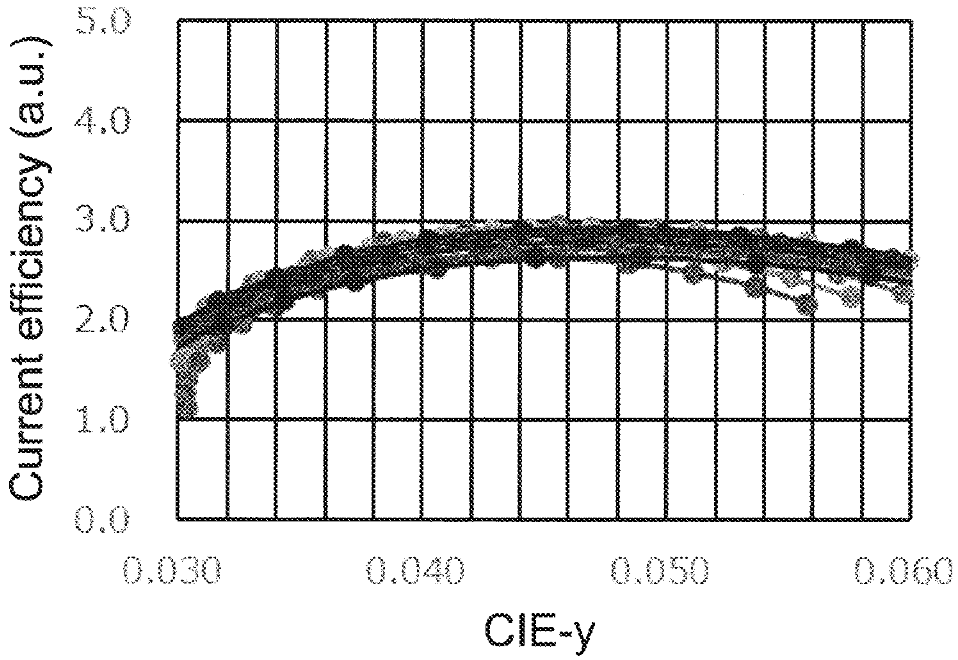
FIG. 12 is a graph showing current efficiency with respect to change in chromaticity (a y coordinate of chromaticity coordinate) in a microcavity structure in a region shown in FIG. 7.

FIG. 12 is a graph showing current efficiency with respect to change in chromaticity (a y coordinate of chromaticity coordinate) in the microcavity structure of the region 300B shown in FIG. 7. In the simulation of the region 300B shown in FIG. 7, glass, aluminum nitride (AlN), magnesium silver (MgAg), aluminum nitride (AlN), and silver (Ag) were used for parameters of the amorphous substrate 110, the first insulating alignment layer 130B-1, the semi-transparent reflective layer 120B, the second insulating alignment layer 130B-2, and the second electrode layer 180, respectively. Gallium nitride (GaN) was used for all parameters of the first semiconductor layer 140, the light emitting layer 150, and the second semiconductor layer 160. Further, the thicknesses of the amorphous substrate 110, the first insulating alignment layer 130B-1, the semi-transparent reflective layer 120B, the first semiconductor layer 140, the light emitting layer 150, the second semiconductor layer 160, and the second electrode layer 180 were 0.5 mm, 60 nm, 15 nm, 10 nm, 20 nm, 20 nm, and 100 nm, respectively. Furthermore, the emission spectrum of the light emitting layer 150 was a normal distribution with a peak at a wavelength of 460 nm.

4. Comparative Example

Figure 13:
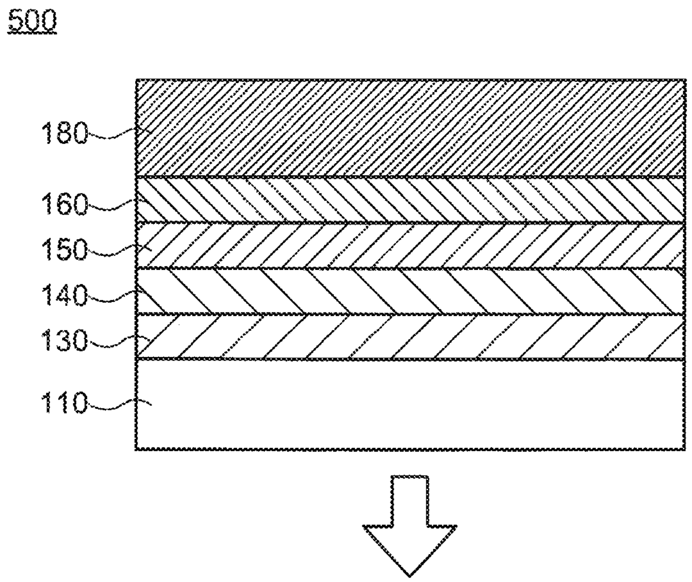
FIG. 13 is a schematic cross-sectional view showing a region of a Comparative Example that does not have a microcavity structure.

FIG. 13 is a schematic cross-sectional view showing a region 500 of a Comparative Example that does not have a microcavity structure. In the region 500, the insulating alignment layer 130, the first semiconductor layer 140, the light emitting layer 150, the second semiconductor layer 160, and the second electrode layer 180 are provided over the amorphous substrate 110 in this order. In the region 500 of the Comparative Example, light emitted from the light emitting layer 150 transmits through the amorphous substrate 110 and is extracted to the outside.

Figure 14:
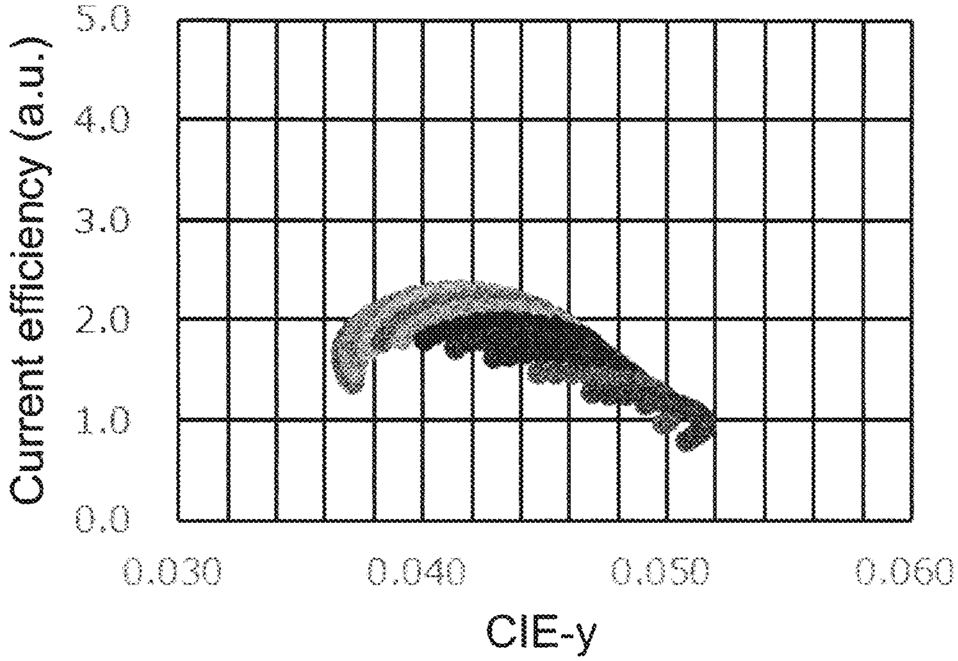
FIG. 14 is a graph showing current efficiency with respect to change in chromaticity (a y coordinate of chromaticity coordinate) in a structure of a region of a Comparative Example shown in FIG. 13.

FIG. 14 is a graph showing current efficiency with respect to change in chromaticity (a y coordinate of chromaticity coordinate) in the structure 500 of the region of the Comparative Example shown in FIG. 13. In the simulation of the region 500 shown in FIG. 13, glass, aluminum nitride (AlN), and silver (Ag) were used for parameters of the amorphous substrate 110, the insulating alignment layer 130, and the second electrode layer 180, respectively. Gallium nitride (GaN) was used for all parameters of the first semiconductor layer 140, the light emitting layer 150, and the second semiconductor layer 160. Further, the thicknesses of the amorphous substrate 110, the first semiconductor layer 140, the light emitting layer 150, the second semiconductor layer 160, and the second electrode layer 180 were 0.5 mm, 10 nm, 20 nm, 20 nm, and 100 nm, respectively. Furthermore, the emission spectrum of the light emitting layer 150 was a normal distribution with a peak at a wavelength of 460 nm.

5. Result

The simulation results were compared between the Examples 1 to 3 and the comparative example. The results of the simulation are shown in Tables 1 and 2. Specifically, Table 1 shows the current efficiency ($\eta_{0.04}$) at CIE-y (the y coordinate of chromaticity coordinate)=0.04 and the current efficiency ($\eta_{0.05}$) at CIE-y=0.05, and the change rate of current efficiency of CIE-y=0.05 with respect to CIE-y=0.04 (($\eta_{0.05}$-$\eta_{0.04}$)/$\eta_{0.04}$×100). Further, Table 2 shows the percentage of the difference between each Example and the Comparative Example, which is normalized by the current efficiency of the Comparative Example ((η(Example)−η (Comparative Example))/η(Comparative Example)×100). From Table 1, it is confirmed that the changes of the current efficiency in change of chromaticity are smaller in the Examples 1 to 3 than in the Comparative Example. Further, from Table 2, it is confirmed that the current efficiencies are improved in the Examples 1 to 3 compared to the Comparative Example. Therefore, the light extraction efficiency is improved and the change of the light extraction efficiency in the change of chromaticity is reduced in the Examples 1 to 3 having the microcavity structure.

TABLE 1

| | Current efficiency $\eta_{0.04}$ (a.u.) | Current efficiency $\eta_{0.05}$ (a.u.) | Change rate of current efficiency (%) |
|---|---|---|---|
| Example 1 | 2.2 | 1.97 | −10.5 |
| Example 2 | 2.1 | 2.2 | +4.7 |
| Example 3 | 2.8 | 2.9 | +3.6 |
| Comparative Example | 2.0 | 1.17 | −41.5 |

TABLE 2

| | Percentage of difference at $\eta_{0.04}$ (%) | Percentage of difference at $\eta_{0.05}$ (%) |
|---|---|---|
| Example 1 | +10 | +68 |
| Example 2 | +10 | +88 |
| Example 3 | +40 | +240 |

Fifth Embodiment

A light emitting device forming substrate 10 according to an embodiment of the present invention is described with reference to FIG. 15.

Figure 15:
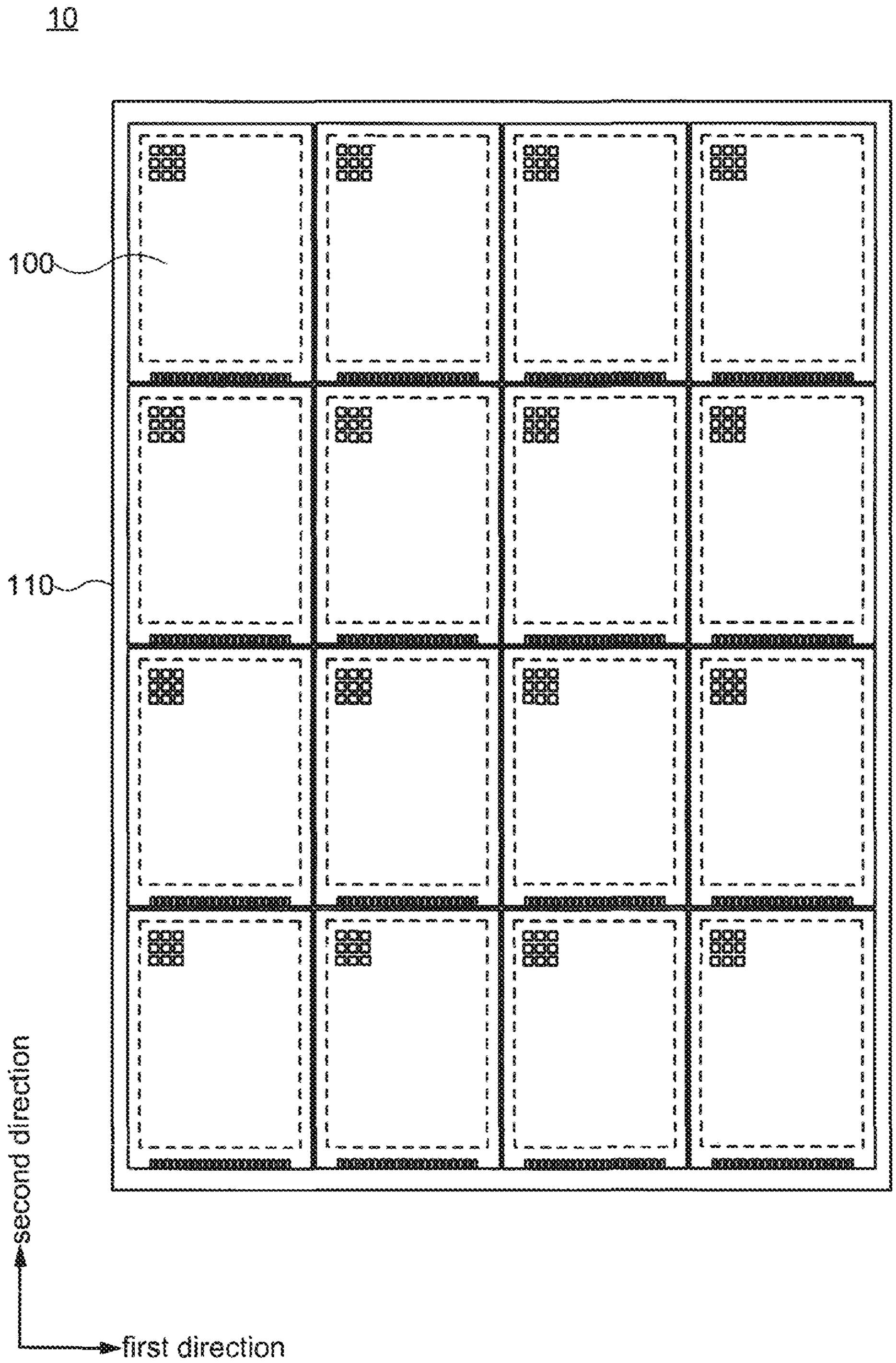
FIG. 15 is a schematic diagram showing a configuration of a light emitting device forming substrate according to an embodiment of the present invention.

FIG. 15 is a schematic diagram showing a configuration of the light emitting device forming substrate 10 according to an embodiment of the present invention. The light emitting device forming substrate 10 includes the plurality of light emitting devices 100. That is, in the light emitting device forming substrate 10, the plurality of light emitting devices 100 are manufactured using one amorphous substrate 110. The amorphous substrate 110 is a so-called large-area substrate. In the light-emitting device forming substrate 10, the plurality of light emitting devices 100 can be manufactured at once using a large-area substrate, so that the manufacturing cost of the light-emitting devices 100 can be suppressed.

Each of the embodiments described above as an embodiment of the present invention can be appropriately combined and implemented as long as they do not contradict each other. Additions, deletions, or design changes of constituent elements, or additions, omissions, or changes to conditions of steps as appropriate based on the respective embodiments are also included within the scope of the present invention as long as the gist of the present invention is provided.

Other effects which differ from those brought about by each of the embodiments described above, but which are apparent from the description herein or which can be readily predicted by those skilled in the art, are naturally understood to be brought about by the present invention.

What is claimed is:

1. A light emitting device comprising:
a plurality of pixels arranged in a matrix in a first direction and in a second direction orthogonal to the first direction,
wherein each of the plurality of pixels comprises:
an amorphous substrate,
a semi-transparent reflective layer over the amorphous substrate,
a first insulating alignment layer over the semi-transparent reflective layer,
a first semiconductor layer over the first insulating alignment layer,
a light emitting layer over the first semiconductor layer,
a second semiconductor layer over the light emitting layer, and
an electrode layer over the second semiconductor layer, and
each of the first semiconductor layer, the light emitting layer, and the second semiconductor layer comprises gallium nitride.

2. The light emitting device according to claim 1,
wherein each of the plurality of pixels further comprises an optical distance adjustment layer between the first semiconductor layer and the light emitting layer, and
the optical distance adjustment layer comprises gallium nitride.

3. The light emitting device according to claim 1, wherein the first semiconductor layer is provided commonly in the plurality of pixels.

4. The light emitting device according to claim 1, wherein the first insulating alignment layer comprises at least one selected from aluminum nitride and aluminum oxide.

5. The light emitting device according to claim 1, wherein the semi-transparent reflective layer comprises at least one selected from silver and magnesium.

6. A light emitting device comprising:
a plurality of pixels arranged in a matrix in a first direction and in a second direction orthogonal to the first direction,
wherein each of the plurality of pixels comprises:
an amorphous substrate,
a first insulating alignment layer over the amorphous substrate,
a semi-transparent reflective layer over the first insulating alignment layer, a first semiconductor layer over the semi-transparent reflective layer, a light emitting layer over the first semiconductor layer, a second semiconductor layer over the light emitting layer, and an electrode layer over the second semiconductor layer, and each of the first semiconductor layer, the light emitting layer, and the second semiconductor layer comprises gallium nitride.

7. The light emitting device according to claim 6, wherein each of the plurality of pixels further comprises a second insulating alignment layer between the semi-transparent reflective layer and the first semiconductor layer.

8. The light emitting device according to claim 6, wherein a thickness of the second insulating alignment layer is larger than a thickness of the first insulating alignment layer.

9. The light emitting device according to claim 6, wherein each of the plurality of pixels further comprises an optical distance adjustment layer between the first semiconductor layer and the light emitting layer, and the optical distance adjustment layer comprises gallium nitride.

10. The light emitting device according to claim 6, wherein the first semiconductor layer is provided commonly in the plurality of pixels.

11. The light emitting device according to claim 6, wherein the first insulating alignment layer comprises at least one selected from aluminum nitride and aluminum oxide.

12. The light emitting device according to claim 6, wherein the semi-transparent reflective layer comprises at least one selected from silver and magnesium.

13. The light emitting device according to claim 6, wherein the amorphous substrate is an amorphous glass substrate.

14. A light emitting device comprising:

a plurality of pixels arranged in a matrix in a first direction and in a second direction orthogonal to the first direction, wherein each of the plurality of pixels comprises:

an amorphous substrate, a first insulating alignment layer over the amorphous substrate, an electrode layer over the first insulating alignment layer, a first semiconductor layer over the electrode layer, a light emitting layer over the first semiconductor layer, a second semiconductor layer over the light emitting layer, and a semi-transparent layer over the second semiconductor layer, and each of the first semiconductor layer, the light emitting layer, and the second semiconductor layer comprises gallium nitride.

15. The light emitting device according to claim 14, wherein each of the plurality of pixels further comprises an insulating layer over the semi-transparent layer.

16. The light emitting device according to claim 14, wherein each of the plurality of pixels further comprises an optical distance adjustment layer between the first semiconductor layer and the light emitting layer, and the optical distance adjustment layer comprises gallium nitride.

17. The light emitting device according to claim 14, wherein the first semiconductor layer is provided commonly in the plurality of pixels.

18. The light emitting device according to claim 14, wherein the first insulating alignment layer comprises at least one selected from aluminum nitride and aluminum oxide.

19. The light emitting device according to claim 14, wherein the semi-transparent reflective layer comprises at least one selected from silver and magnesium.

20. The light emitting device according to claim 14, wherein the amorphous substrate is an amorphous glass substrate.

* * * * *